United States Patent [19]

Belkin

[11] 4,400,667
[45] Aug. 23, 1983

[54] PHASE TOLERANT BIT SYNCHRONIZER FOR DIGITAL SIGNALS

[75] Inventor: Martin Belkin, Sarasota, Fla.

[73] Assignee: Sangamo Weston, Inc., Norcross, Ga.

[21] Appl. No.: 224,421

[22] Filed: Jan. 12, 1981

[51] Int. Cl.$^3$ ............................................. H03B 3/04
[52] U.S. Cl. ....................................... 331/1 A; 331/17; 331/34; 331/DIG. 2; 375/120
[58] Field of Search .................. 331/1 R, 1 A, 17, 34, 331/144, DIG. 2, 11, 12, 25; 360/41; 329/104; 328/133; 333/155; 375/81, 120, 3

[56] References Cited

U.S. PATENT DOCUMENTS

| | | | |
|---|---|---|---|
| 3,805,180 | 11/1974 | Widmer | 331/1 A |
| 3,944,940 | 3/1976 | Desai | 375/81 X |
| 3,992,581 | 11/1976 | Davis | 375/3 X |
| 4,017,803 | 4/1977 | Baker | 375/81 X |
| 4,055,814 | 10/1977 | Abraham et al. | 331/1 A |
| 4,085,288 | 4/1978 | Viswanathan | 375/120 |
| 4,129,748 | 12/1978 | Saylor | 375/120 |
| 4,209,905 | 6/1980 | Abraham | 178/88 |

OTHER PUBLICATIONS

Handbook of Telemetry and Remote Control, McGraw-Hill, 1967, pp. 8-30-8-36.
Motorola Applications Handbook 1972, MC 4344/4044 Phase Locked Loop Chip, pp. 1-14.

*Primary Examiner*—Siegfried H. Grimm
*Assistant Examiner*—Tim A. Wiens
*Attorney, Agent, or Firm*—Dale Gaudier

[57] ABSTRACT

A bit synchronizer for digital data signals capable of tracking phase errors of up to ±180° without loss of lock. An input data signal is squared and then applied to a pair of D-type flip-flops. The flip-flops are alternately driven by a clock signal generated by a voltage controlled oscillator in a phase-locked loop. The flip-flops cause the input data to be shifted 0° and 180°, respectively, with reference to the clock signal. The flip-flops are cross-coupled to a pair of exclusive-OR gates, in a manner such that as the phase error between the input signal and the clock signal increases or decreases, the pulse width out of one gate varies proportionately while the output of the other gate is a pulse which is always one-half the clock signal period. The phase relationship of the pulses out of the gates switch 180° as the phase error traverses the 0° point. The outputs of the gates are summed to provide a measure of the phase error between the clock signal and the input signal and to produce a net control voltage representative thereof. The control voltage is applied to the oscillator to cause the frequency and phase of the clock signal generated thereby to be synchronous with that of the input signal. In the absence of bit transitions, the phase-locked loop is biased to seek the tuned bit rate. The described arrangement permits tracking phase errors over a ±180° range without loss of synchronization.

16 Claims, 2 Drawing Figures

PHASE TOLERANT BIT SYNCHRONIZER FOR DIGITAL SIGNALS

TECHNICAL FIELD

The invention relates to the field of bit synchronizers and, more particularly, to a phase tolerant bit synchronizer for digital signals capable of tracking large phase errors without loss of phase lock.

BACKGROUND ART

In the digital recording art it is common to record data signals in what is commonly known as the non-return-to-zero (NRZ) format. In the NRZ format there are two levels states, one representing a binary one (or "mark"), and the other representing a binary zero (or "space"). A bit pulse remains in one of its two level states for the entire bit interval. Clocking information from such data signals is generally recovered by using a one-shot (monostable multivibrator) to generate a pulse for every input data transition, the pulse being adjusted to be approximately one-half the bit width. The pulses are used to drive a phase-locked loop having a local oscillator tuned to the expected bit rate. The phase-locked loop can be thought of as a relatively narrow-band high-Q filter whose center frequency follows or tracks the rate of the received bit transition pulses. The phase-locked loop generally includes some sort of phase detecting means to allow the local oscillator to follow both the phase and the frequency of the incoming data signal.

In a typical phase detector, the phase of the half-bit width pulse is compared with that of a square wave (and complement) produced by the local oscillator (usually a voltage controlled oscillator).

If the voltage controlled oscillator (VCO) is at the exact frequency and correct phase, then the mean voltage level out of the phase detector will be zero and will provide no error signal for the VCO. If, on the other hand, a frequency or phase error is present, the output of the phase detector will be asymmetrical, resulting in a DC level being generated by the phase detector. This signal is then filtered by the loop filter of the phase-locked loop, and is used to control the VCO to bring it back to the correct frequency and phase.

One common type of phase detector is known as the early gate-late gate phase detector and consists in its simplest form of two logic AND gates, one being used to AND gate the VCO waveform with the leading edge of the one-shot square wave, while the other is used to AND gate the 180° phase-shifted VCO output with the trailing edge of the one-shot multivibrator complement. The outputs of the two AND gates are OR gated (summed) together.

However it is a characteristic of most such phase detectors and phase-locked loops that the phase of the VCO must be less than +90° or greater than −90° in order for the system to be pulled into synchronization. A phase difference between the VCO phase detector of less than −90° or greater than +90° tends to produce an error signal which will make the phase error even greater between the VCO and the incoming NRZ data envelope.

A further disadvantage is that the pulse width and frequency of a one-shot multivibrator is dependent upon the value of a timing element, namely a capacitor. In many data recording systems, it is common to encounter data recording rates which span a 1000 to 1 range. This results in undue complexity for prior art bit synchronizers of the one-shot type since a different timing element or capacitor is needed for each anticipated data rate.

DISCLOSURE OF INVENTION

The present invention is directed toward a phase tolerant bit synchronizer which overcomes the disadvantages and drawbacks of the prior art. To this end, the bit synchronizer of the present invention comprises a voltage controlled oscillator which generates a first clock signal whose frequency varies as a function of a net control voltage applied to the oscillator, means for generating a second clock signal shifted by 180° from the first clock signal, means responsive to the first and second clock signals for respectively outputting first and second signals representative of the data signal, the second signal being shifted by an amount proportional to the phase difference between the second clock signal and the input data signal, and the first signal being shifted by one-half bit period from the second signal, means responsive to the input data signal and the first data representative signal for producing a first output signal having a width proportional to the phase difference between the data signal and the first clock signal, means responsive to the second data representative signal and the complement of the first data representative signal for producing a second output signal having a fixed width of one-half bit period, and means for summing the output signals to generate a net control voltage which is applied to the oscillator, whereby the frequency and phase of the first clock signal are synchronized with that of the received data signal.

In the preferred embodiment the means for outputting the first and second data representative signals comprise a pair of clocked registers, such as D-type flip-flops, having their respective data inputs responsive to the data signal, one register having its clock input connected to the first clock signal and its normal (SET) output connected to an input of the variable width output signal generating means and its complementary (RESET) output connected to an input of the fixed width output signal generating means, the second flip-flop having its clock input connected to the second clock signal and its normal (SET) output connected to an input of the fixed width output signal generating means.

The fixed and variable width output signal generating means preferably comprise exclusive-OR gates, the outputs of which are summed together to produce the net control voltage for the oscillator means.

The oscillator means may further comprise a phase-locked loop including a loop amplifier, a loop filter, and a voltage controlled oscillator all connected in series, the oscillator generating the first clock signal whose frequency varies as a function of the net control voltage developed by summing the output of the exclusive-OR gates. The second clock signal is readily generated by applying the first clock signal to an inverter whose output will then be 180° displaced from the first clock signal.

The phase-locked loop may further include means for maintaining phase-lock therein in the absence of data transitions in said received data signal. This is especially important when attempting to recover timing information from an NRZ data signal which may have a long series of ones or zeroes and thereby lack a sufficient numer of data transitions in order to accurately track the data signal during these transitionless periods.

Preferably, the means for maintaining phase lock comprises a pair of diodes and a resistance all connected in parallel to the output of the summing means, the diodes having their polarities reversed with respect to each other and the resistance being of a value substantially greater than the resistance of a R-C type loop filter. In this manner, the average signal value of the R-C filter is maintained when no output signals are produced by the exclusive-OR gates (as when there are no data transitions in the received data signal), so that the first clock signal is generated at a rate synchronized to the average value of the bit rate of the last received data signal having available timing information.

Several advantages flow from the above described arrangement. First, this arrangement eliminates the use of a one shot multivibrator and associated timing capacitors whose value had to be changed whenever the received data bit rate changes substantially. This is especially advantageous in the data recording environment where data bit rates and recording speeds can vary over a 1000 to 1 speed range.

The above described arrangment advantageously tracks phase errors over a range of ±180° using a minimum number of circuit components. With this arrangement the phase relationship of the output signals of the exclusive-OR gates switch 180° as the phase error traverses the 0° point. Thus, the output of the voltage controlled oscillator is driven so that the clock signals are in phase with the received data signals. This insures that optimum sampling of the received data signal will take place midway in the received data input bit cell.

A further advantage is that the voltage controlled oscillator operates at the bit rate of the received data signal (for NRZ signals), thus eliminating the need for high frequency clocks operating at multiples of the bit rate as are utilized in prior art bit synchronizers. For example, many prior art devices have clocks which run at four to eight times the bit rate. Thus, a prior art bit synchronizer which receives a data signal at 4 megahertz would need a clock running at between 16 and 32 megahertz. Such high frequency oscillators tend to be more complex and require more critical circuit tolerances than is the case for the present invention wherein the oscillator need only operate at the bit rate.

Another advantage of the present invention is that it can operate with other types of data encoding schemes such as biphase (Manchester), delay-modulation (Miller), or delay-modulation squared (Miller-squared) having at least one data transition per bit cell. In such cases, the oscillator would, in effect, operate at a multple of the bit rate (generally 2 times) of the input signal due to the greater number of bit transitions per cell (generally 2) as compared to NRZ encoding schemes. This represents the minimum possible oscillator frequency for such types of encoding schemes.

The arrangement of reversed, parallel diodes and a high resistance connected between the outputs of the exclusive-OR gates and the R-C type loop filter advantageously prevents the signal stored by the capacitor of the loop filter from discharging during periods wherein there is no output signal from the OR-gates. In this manner, the R-C filter maintains the average signal value of the most recently received data signal and thus tends to bias the phase-locked loop to the tuned bit rate during such transitionless periods.

BRIEF DESCRIPTION OF DRAWINGS

These and other features and advantages of the present invention will be readily apparent from the following description of the best mode of carrying out the invention and as shown in the accompanying drawing figures wherein.

BEST MODE FOR CARRYING OUT THE INVENTION

Figure 1:
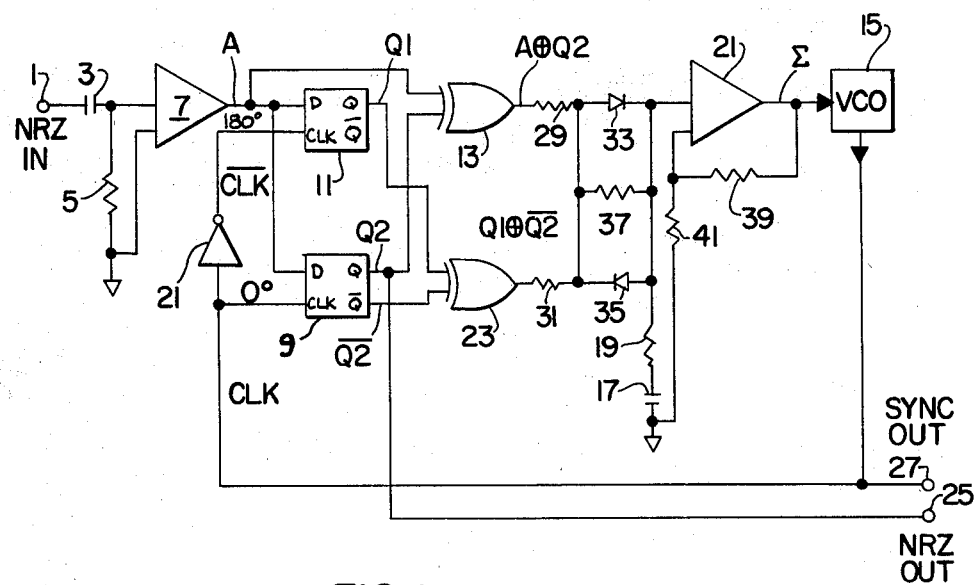
FIG. 1 is a schematic diagram of the circuitry of the present invention.

With reference to FIG. 1, a source of digital data signals (not shown), such as of the NRZ encoded type, is applied to input terminal 1. Capacitor 3 and resistor 5 act as a preemphasis circuit for the input signal which is then applied to squaring circuit 7. Squaring circuit 7 acts to take the input data signal, whose data transition edges may have undergone spreading or corruption, and produces an output signal A (FIG. 2) representative of the input signal but having considerably sharper or "squarer" data transitions. Squaring circuits of this type are well known and in their simplest form comprise a comparator as shown in FIG. 1.

The squared data signal A from squaring circuit 7 is applied to the inputs of registers 9 and 11 and into one input of a phase error detecting circuit 13, which preferably is an exclusive-OR gate. Registers 9 and 11, for example, are D-type flip-flops, each having a D input, a clock input, a Q (SET or normal) output, and a $\overline{Q}$ (RESET or complement of Q) output. A D-type flip-flop acts as a storage element. When a clock pulse is applied to its clock input the logical status of the D input is transferred to the Q output and its complement is transferred to the $\overline{Q}$ output (generally on the rising edge of the clock wave form).

Also shown in FIG. 1 is a phase locked loop (PLL) comprising a voltage controlled oscillator (VCO) 15, a loop filter consisting of capacitor 17 and series resistor 19, and a loop amplifier 21. One side of capacitor 17 is connected to ground and the other to one end of resistor 19. The other end of resistor 19 is connected to a first input of amplifier 21. The output of amplifier 21 is a control (error) voltage which, when applied to an input of VCO 15 acts to vary the output frequency of the VCO in proportion to the applied control voltage.

The output of VCO 15 is a square wave having a frequency tuned to approximately the bit rate of the input data signal. The VCO clock signals, CLK, are applied to the clock input of register 9 and to an inverter 21 which generates a second clock, $\overline{CLK}$, which is 180° out of phase with the first clock signal. $\overline{CLK}$ is applied to the clock input of register 11.

The Q output of register 11, denoted as Q1, is applied to an input of a second phase detecting circuit 23, comprised of an exclusive-OR gate, which also receives an output signal $\overline{Q2}$ from the $\overline{Q}$ output of register 9. The Q output of register 9, denoted as Q2 is applied to the other input of exclusive-OR gate 13. Output signal Q2 in effect duplicates the squared input data signal A, but is offset therefrom by 180°. Output signal Q2 is applied to output terminal 25 as the NRZ output signal to which the phase and frequency of which the first clock signal generated by the VCO is to be synchronized. The synchronous clock output, CLK, of VCO 15 is applied to output terminal 27.

As is well known, optimum sampling of an NRZ data signal occurs when the signal is sampled midway in each bit cell. However, such sampling often takes place in the presence of various corrupting factors, such as those due to time or phase jitter, noise, etc. Since phase differences of ±180° can occur between an input data signal and a recovered clock signal due to such corruption, some means must be provided for detecting such phase differences and for adjusting the phase and frequency of a clock signal so that the leading edge of the clock signal pulse (which will be used to trigger bit sampling in a data receiver) is synchronous with the mid-point of a received data bit cell.

To this end, the circuit of FIG. 1 detects and adjusts for phase differences between the input data signal and the clock signal of up to one full clock cycle (i.e. ±180°), while still providing a locked condition for the phase-locked loop.

Figure 2:
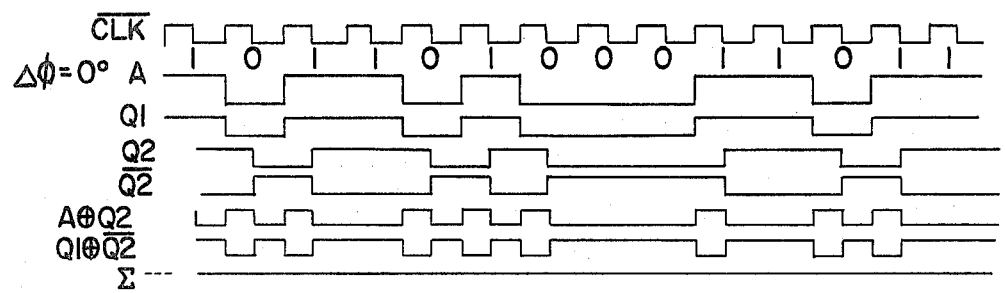
FIG. 2 is a chart showing the phase relationships between various wave forms generated by the circuit of FIG. 1.
Figure 2:
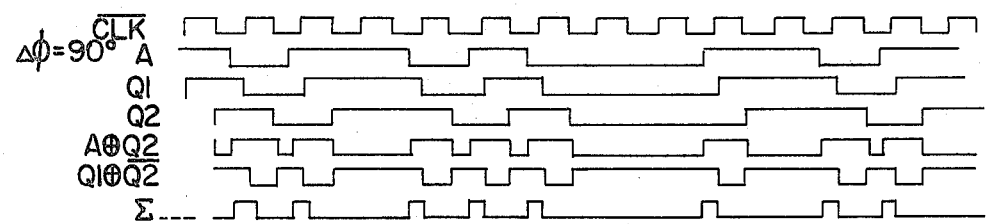
Figure 2:
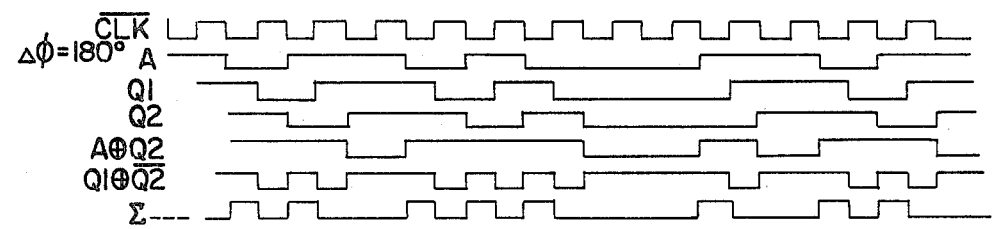
Figure 2:
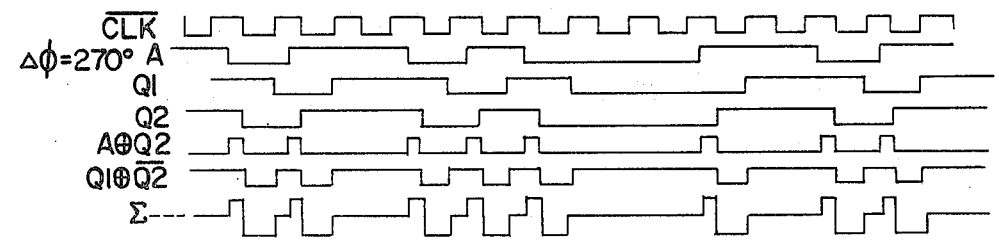
Figure 2:
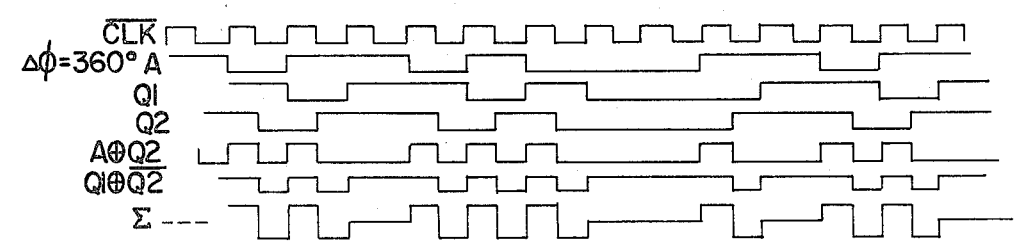

The operation of the circuit shown in FIG. 1 is as follows. The squared input data, shown as waveform A in FIG. 2, is applied to the D inputs of both registers 9 and 11. The output of VCO 15, denoted as CLK in FIG. 1 is applied to the clock input of register 9 and to inverter 21. Inverter 21 inverts the first clock waveform, CLK, to generate the second clock, $\overline{CLK}$, which is 180° out of phase with the first clock. $\overline{CLK}$ is applied to the clock input of register 11.

With reference to FIG. 2, it can be seen that the clocked output Q1 of register 11 is a waveform of substantially identical shape to that of the squared input data waveform, A, but is displaced by an amount $\Delta\phi$ which is proportional to the difference in phase between the leading edge of $\overline{CLK}$ and the leading edge of the input data transitions A. The output Q2 of register 9 is identical in shape to that of Q1 but is offset by 180° therefrom since register 9 is driven by the first clock, CLK, which is displaced by 180° from the second clock $\overline{CLK}$ which drives register 11. The other output $\overline{Q2}$ of register 9 is merely the logical complement of Q2; i.e. when Q2 is HIGH (logical 1) $\overline{Q2}$ is LOW (logical 0), and vice versa. The complementary output $\overline{Q}$ of register 11 is not used.

The input data signal A and output signal Q2 from register 9 are applied to the inputs of exclusive-OR gate 13. The resultant signal, A⊕Q2, is a pulse whose width varies directly in proportion to the difference in phase, $\Delta\phi$, between the input data signal A and the first clock signal CLK. Output signal Q1 from register 11 and output signal $\overline{Q2}$ from register 9 are applied to the inputs of exclusive-OR gate 23. As shown in FIG. 2 the signal $\overline{Q2}$ is merely an inverted or mirror image of Q2 and thus will always be of complementary value and differ in phase by 180° from the output signal Q1. The combination of these two signals, Q1⊕$\overline{Q2}$, in exclusive-OR gate 23 results in an output signal therefrom having a fixed pulse width of exactly one-half of the clock period (i.e. a width of one-half bit cell).

The outputs of gates 13 and 23 are respectively summed through resistors 29 and 31. The summed output signals are applied to the first input of PLL amplifier 21 through a parallel network of reversed diodes 33 and 35 and resistor 37. Resistors 39 and 41, respectively connected from the output of loop amplifier 21 and ground to a second input of the loop amplifier, generate the necessary feedback and control voltages for the amplifier.

Resistor 37 is of a value substantially greater than the resistance provided by the loop filter resistor 19. Diodes 33 and 35 insure that loop filter capacitor 17 is constantly charged so long as gates 13 or 23 are outputting signals. In the event that no signal is produced by either gate 13 or 23, such as due to a tape drop-out or when a long transitionless period occurs (such as might happen with NRZ encoded signals), the junction between resistors 29 and 31 takes on an average value of the half-logic level. The voltage to the first input of loop amplifier 21 is also at the half-logic level so that neither diode 33 nor 35 is conducting. Thus capacitor 17 of the loop filter has no discharge path except through resistor 37. However, since the value of resistor 37 is substantially greater (ten times or more) than that of the loop filter resistor 19, the voltage at the first input to amplifier 21 will be held at its previous value until such time as a signal is output by gates 13 or 23. Thus, in the absence of an input signal or data transitions, VCO 15 will output a clock signal based on the average value of the most recently received data signal since the center frequency of the loop filter (as controlled by the amount of charge on capacitor 17) is held to substantially the frequency of the bit rate of the most recently received signal having data transitions.

The summed and amplified control signal output by amplifier 21, $\Sigma$, is shown in FIG. 2. The control signal $\Sigma$ is a pulse whose sign and width are a measure of the error in phase and frequency between the clock signal, CLK, generated by VCO 15 and the input data signal. This error signal is applied to an input of VCO 15 to cause the phase and frequency of the VCO output signal, CLK, to be adjusted to be synchronous with that of the input data signal.

With reference to FIG. 2, it can be seen that in the case where there is no phase difference between the leading edge of CLK and the leading edge of the data transitions A (i.e.$\Delta\phi=0°$) the outputs of exclusive OR gates 13 and 23, A⊕Q2 and Q1⊕$\overline{Q2}$, are complementary to one another and thus their sum $\Sigma$ (the error signal) is zero. In other words, no error signal is generated since the phase and frequency of the VCO output signal, CLK, are synchronized with the phase and frequency of the input data transitions, and the clock transitions occur precisely at the optimum point within each input data bit cell, i.e. at the midpoint of each bit cell.

However, if a phase difference does arise between the input data signal and the VCO clock signal (such as if $\Delta\phi$ does not equal 0°) the control signal $\Sigma$ developed from exclusive-OR gates 13 and 23 will be a series of pulses whose time-integrated sign and value will tend to drive the oscillating frequency and phase of CLK generated by VCO 15 into synchronization with the input data signal.

Unlike previously suggested early gate-late gate type phase detection schemes, the circuit of the present invention maintains phase-lock between the input data signal and the clock signal even for phase difference of up to one full clock cycle (i.e. ±180°). This is due to the fact that the phase relationship of the pulses out of exclusive-OR gates 13 and 23 switch 180° as the phase error, $\Delta\phi$, traverses the 0° point.

Thus, the described circuit generates a clock signal synchronous with an input data signal with the capability of tracking and correcting phase differences therebetween of up to ±180°. In addition, the VCO clock signal is generated at the bit rate (for NRZ signals) rather than at multiples thereof. This reduces substantially the complexity of the VCO circuit and, further, eliminates the need for separate timing capacitors and associated switching circuitry therefor as used in prior art bit synchronizers having one-shot multivibrators to generate timing pulses over a wide range of bit rates. Further, the provision of diodes 33, 35 and resistor 37 between the outputs of exclusive-OR gates 13 and 23 and the input of loop amplifier 21 causes the phase-locked loop to be biased to seek the tuned bit rate in the absence of bit transitions or an input signal.

While the present invention has been described with respect to an implementation wherein NRZ encoded signals are used, it is to be understood that the present invention is adaptable without any further modification for use with biphase (Manchester), delay-modulation (Miller), or delay-modulation squared (Miller squared) encoded signals. These encoding schemes are characterized by having at least two transitions per bit cell. In such a case, the VCO output, CLK, would in effect run at twice the bit rate since there are twice as many data transitions per bit cell in these encoding schemes as opposed to NRZ encoding.

While the present invention has been described in considerable detail, various changes and modifications will occur to those skilled in the art. For example, while the invention has been described with respect to discrete registers and exclusive-OR gates, these functions may be combined in one single device which produces the desired variable and fixed width output signals. The two phases of clock signal can be generated in any conventional manner. In addition, loop amplifier 21 can be an inverting amplifier with the connections between registers 9 and 11 and gates 13 and 23 being slightly modified so that output $\overline{Q2}$ is applied to gate 13 and the complementary output of register 11, $\overline{Q}$ is applied to gate 23. This in effect inverts the polarities into gates 13 and 23, which gives output polarities therefrom which are opposite from those shown in FIG. 1. These inverted polarities are summed to produce an inverted error signal which is amplified by an inverting-type loop amplifier to generate a control signal for VCO 15 of proper magnitude and sign.

The foregoing description is not intended to be limitive or exhaustive but rather illustrative of the invention which is defined by the appended claims.

What is claimed is:

1. Apparatus for generating a clock signal synchronous with the bit rate of a received data signal comprising:
   voltage controlled oscillator means, said oscillator means generating a first clock signal whose frequency varies as a function of a net control voltage applied thereto;
   means for generating a second clock signal shifted by 180° from said first clock signal;
   means responsive to said first and second clock signals and said received data signal, for respectively outputting first and second signals representative of said received data signal, said second signal being shifted by an amount proportional to the phase difference between said second clock signal and said received data signal, and said first signal being shifted by one-half bit period from said second signal;
   means responsive to said received data signal and said first data representative signal, for producing a first output signal having a variable width proportional to the phase difference between said received data signal and said first clock signal;
   means responsive to said second data representative signal and the complement of said first data representative signal, for producing a second output signal having a fixed width of one-half bit period; and
   means for summing said output signals to generate a net control voltage which is applied to said oscillator means, whereby the frequency and phase of said first clock signal is synchronized with that of said received data signal.

2. The apparatus of claim 1 wherein said second clock generating means is an inverter responsive to said first clock signal.

3. The apparatus of claim 1 further including filter means connected between said summing means and said oscillator means, said filter means including means for maintaining phase lock between said first clock signal and said received data signal in the absence of received data transitions in said data signal.

4. The apparatus of claim 1 further including means for squaring said received data signals prior to their application to said data representative signal outputting means.

5. The apparatus of claim 1 wherein said means for outputting first and second data representative signals comprise a pair of clocked register means, each register means having an input for receiving said received data signals, one of said register means being clocked by said first clock signal and the other of said register means being clocked by said second clock signal.

6. The apparatus of claim 5 wherein said register means comprise first and second D-type flip-flops, said flip-flops having their respective D inputs connected to said received data signal, said first flip-flop having its clock input connected to said first clock signal and its Q output connected to an input of said variable width output signal producing means and its $\overline{Q}$ output connected to an input of said fixed width output signal producing means, said second flip-flop having its clock input connected to said second clock signal and its Q output connected to an input of said fixed width output signal producing means.

7. The apparatus of either claim 1 or 6 wherein said fixed and variable width output signal generating means each comprise exclusive-OR gates.

8. Apparatus for generating a clock signal synchronous with the bit rate of a received data signal comprising:
   phase-locked loop means including a loop filter, a loop amplifier, and a voltage controlled oscillator, said oscillator generating a first clock signal whose frequency varies as a function of a net control voltage applied thereto;
   means for generating a second clock signal shifted by 180° from said first clock signal;
   first and second register means, each having inputs responsive to said received data signal and inputs responsive respectively to said first and second clock signals, each register outputting first and second signals representative of said received data signal and the logical complement of said received data signal, the output signals of said second register means being shifted by one-half bit period from the output signals of said first register means;
   first and second phase error detecting means, said first phase error detecting means having an input responsive to said first output signal of said second register means and to said complementary signal output of said first register means whereby said first phase error detecting means produces an output signal having a fixed width of one-half bit period, said second phase error detecting means having an input responsive to said received data signal and to said first signal output of said first register means, whereby said second phase error detecting means produces an output signal complementary to said fixed width output signal and having a width proportional to the phase difference between said received data signal and said first clock signal; and means for summing said output signals of said phase error detecting means to generate a net control voltage which is applied to said phase-looked loop means, whereby the frequency and phase of said first clock signal is synchronized with that of said received data signal.

9. The apparatus of claim 8 wherein said second clock generating means is an inverter responsive to said first clock signal.

10. The apparatus of claim 8 further including means for squaring said received data signals prior to their application to said register means.

11. The apparatus of claim 8 wherein said register means each comprise D-type flip-flops each having D and clock inputs and wherein said first and second outputs respectively are Q and Q outputs.

12. The apparatus of either claim 8 or 11 wherein each said phase error detecting means comprise logic means for performing an exclusive-OR function.

13. The apparatus of claim 8 wherein said received data signal is an NRZ encoded signal and said first clock signal is generated at the bit rate of said received data signal.

14. The apparatus of claim 8 wherein said received data signal is a biphase, delay-modulation, or delay-modulation squared encoded signal and said first clock signal is generated at twice the bit rate of said received data signal.

15. The apparatus of claim 8 further including means for maintaining phase-lock in said phase-locked loop in the absence of data transitions in said received data signal.

16. The apparatus of claim 15 wherein said loop filter comprises an R-C filter containing a resistor and a capacitor connected in series, said resistor being connected to an input to said loop amplifier and said capacitor being connected to groun said loop amplifier containing an output which is connected to an input to said oscillator, and wherein said phase-lock maintaining means comprises a pair of diodes and a resistance all connected in parallel to the output of said summing means, said diodes having their polarities reversed with respect to each other and said resistance being of a value substantially greater than the resistance of said R-C filter such that the center frequency of said loop filter is maintained at the previous received data signal bit rate in the absence of output signals from said phase error detecting means, whereby said first clock signal is generated at a rate synchronized to the average value of the bit rate of the previously received data signal.

* * * * *

UNITED STATES PATENT AND TRADEMARK OFFICE
CERTIFICATE OF CORRECTION

PATENT NO. : 4,400,667
DATED : August 23, 1983
INVENTOR(S) : Martin Belkin

It is certified that error appears in the above-identified patent and that said Letters Patent are hereby corrected as shown below:

Column 1, line 15, "levels" should read -- level --.

Column 3, line 1, "numer" should read -- number --.

Column 3, line 24, "arrangment" should read -- arrangement --.

Column 3, lines 53 and 54, "multple" should read -- multiple --.

Column 5, line 42, "Q2" (first occurrence) should read -- $\overline{Q2}$ --.

Claim 8, column 8, line 51, "phase-looked" should read -- phase-locked --.

Claim 8, column 9, line 16, "phase-looked" should read -- phase-locked --.

Claim 11, column 9, line 29, "Q" (second occurrence) should read -- $\overline{Q}$ --.

Claim 16, column 10, line 18, "groun" should read -- ground, --.

Signed and Sealed this

Twenty-fifth Day of October 1983

[SEAL]

Attest:

GERALD J. MOSSINGHOFF

*Attesting Officer*     *Commissioner of Patents and Trademarks*